United States Patent [19]
Andrieu et al.

[11] Patent Number: 5,530,361
[45] Date of Patent: Jun. 25, 1996

[54] METHOD AND APPARATUS FOR MEASURING THE STATE OF CHARGE OF AN ELECTROCHEMICAL CELL PULSE PRODUCING A HIGH DISCHARGE CURRENT

[75] Inventors: Xavier Andrieu, Bretigny sur Orge; Philippe Poignant, Villebon/Yvette, both of France

[73] Assignee: Alcatel NV, Amsterdam, Netherlands

[21] Appl. No.: 389,082

[22] Filed: Feb. 14, 1995

Related U.S. Application Data

[63] Continuation of Ser. No. 994,872, Dec. 23, 1992, abandoned.

[30] Foreign Application Priority Data

Dec. 27, 1991 [FR] France .................... 91 16239

[51] Int. Cl.⁶ .................................. G01N 27/416
[52] U.S. Cl. ............................ 324/426; 324/427
[58] Field of Search .................. 320/48; 324/426, 324/427, 430, 436; 340/636

[56] References Cited

U.S. PATENT DOCUMENTS

| | | | |
|---|---|---|---|
| 3,676,770 | 7/1972 | Sharaf et al. | 324/436 |
| 3,984,768 | 10/1976 | Staples | 324/378 |
| 4,333,149 | 6/1982 | Taylor et al. | 364/481 |
| 4,644,245 | 2/1987 | Brown | 320/13 |
| 4,719,428 | 1/1988 | Liebermann | 324/436 |
| 4,849,700 | 7/1989 | Morioka et al. | 324/427 |
| 4,912,416 | 3/1990 | Champlin | 324/430 |
| 4,947,124 | 8/1990 | Hauser | 324/430 |
| 5,047,722 | 9/1991 | Wurst et al. | 324/430 |

Primary Examiner—Kenneth A. Wieder
Assistant Examiner—Glenn W. Brown
Attorney, Agent, or Firm—Robbins, Berliner & Carson

[57] ABSTRACT

The state of charge of an electrochemical storage unit is measured by applying to the electrochemical storage unit (32), a voltage pulse which is less than its nominal voltage, so as to make the storage unit deliver a high discharge current for a short period of time. The level of the voltage pulse is chosen to cause a discharge current that varies monotonically and preferably approximately linearly as a function of the state of charge of the storage unit, so that the state of charge can be unambiguously estimated by measuring the discharge current.

9 Claims, 4 Drawing Sheets

METHOD AND APPARATUS FOR MEASURING THE STATE OF CHARGE OF AN ELECTROCHEMICAL CELL PULSE PRODUCING A HIGH DISCHARGE CURRENT

This is a continuation of application Ser. No. 07/994,872 filed on Dec. 23, 1992, now abandoned.

The invention relates to methods and apparatus making it possible to indicate the state of charge of an electrochemical storage unit. For example, the electrochemical storage unit is a secondary cell, or is constituted by a battery of secondary cells. The term "battery of secondary cells" is used to mean an assembly constituted by a plurality of secondary cells, e.g. connected in series.

In known manner, the voltage characteristic of a secondary cell as a function of its discharge capacity, e.g. expressed in Ah, does not present any major variation for a large majority of discharge characteristics, and it is therefore not possible to determine the charge of the secondary cell by merely measuring the voltage across its terminals. This observation is particularly true for nickel-cadmium type secondary cells.

That is why methods of measuring the state of charge of a battery either use sensors (for sensing the temperature of the battery, its internal pressure, etc,) or use electrical measurements (measuring the internal impedance of the battery, coulometry, and pulse measurement).

U.S. Pat. No. 4,644,245, to Harry B. Brown, describes a method of measuring the state of charge of a battery of nickel-cadmium secondary cells.

That method consists in periodically applying very low value resistive load for very short intervals of time across the terminals of the battery under test, so that a high current is discharged from the battery into the load. Discharge current pulses are thus obtained which make the voltage across the terminals of the battery drop to a voltage value which is measured. This voltage value is proportional to the state of charge of the battery. A display enables the state of charge of the battery to be indicated directly, the state of charge being proportional to the voltage delivered by the battery when the battery outputs the discharge current. That method therefore consists in exciting a battery of secondary cells by means of a controlled current (constant current excitation).

The main drawback of that method is that applying controlled-current stress assumes that the capacity of the battery is known, and the resistive load applied periodically across the terminals of the battery must therefore be matched to the type of secondary cell making up the battery. If the current is discharged by a small size secondary cell, the secondary cell may be damaged if the current is not matched to the secondary cell. The apparatus performing that method of measuring state of charge therefore may not be used with different types of electrochemical storage unit (nickel-cadmium, lead-acid, and nickel-hydrogen secondary cells, or primary cells, etc.).

Furthermore, it is possible to measure the state of charge of the battery only when the battery is not powering an electrical circuit, i.e. not in operation. When pulse discharging is performed, the voltage supplied by the battery and enabling its state of charge to be estimated may become very low and even zero if the battery is close to its discharged state. State of charge cannot therefore be measured in-circuit.

An object of the present invention is to mitigate those drawbacks.

More precisely, an object of the invention is to provide a method of measuring the state of charge of an electrochemical storage unit, which method can be used with different types of storage unit, regardless of their original states of charge.

Another object of the invention is to provide such a measuring method that can be performed when the electrochemical storage unit is in circuit, i.e. when it is powering an electrical circuit.

Another object of the invention is to provide apparatus for performing such a method.

These objects, and others that appear below, are achieved by means of a method of measuring the state of charge of an electrochemical storage unit, the method being of the type consisting in applying a pulse stress to the electrochemical storage unit and in observing the response of the electrochemical storage unit to the stress so as to estimate the state of charge of the storage unit, the method consisting in:

applying a voltage pulse to the electrochemical storage unit, which voltage pulse is of value less than the nominal voltage of the electrochemical storage unit so as to make the storage unit deliver a discharge current, the value of the discharge current being such that the electrochemical storage unit has an unambiguous internal impedance characteristic as a function of its state of charge; and measuring the discharge current delivered by the electrochemical storage unit so as to estimate the state of charge thereof.

The method of the invention is therefore based on generating a voltage pulse intended to cause a discharge current to be output by the electrochemical storage unit whose state of charge is to be determined.

In a particular embodiment, the electrochemical storage unit is a secondary cell or a battery of secondary cells.

Advantageously, the discharge current is measured immediately after the end of the voltage pulse.

Preferably, the voltage of value less than the nominal voltage is not less than a minimum voltage required by an electrical circuit whose power source is constituted by the electrochemical storage unit.

The electrochemical storage unit whose state of charge is measured may therefore be in-circuit, i.e. it may be powering an electrical circuit, and the measurement will have no detrimental effect on circuit operation.

Advantageously, the method of the invention is applied to measuring the state of charge of nickel-cadmium type secondary cells.

The invention also provides apparatus for measuring the state of charge of an electrochemical storage unit, the apparatus including:

a load enabling a discharge current to be drawn from the electrochemical storage unit on command, which discharge current is high enough for the internal impedance characteristic of the storage unit as a function of its state of charge to be unambiguous;

means for measuring the discharge current; and means for imposing a predetermined voltage across the terminals of the electrochemical storage unit so that the measurement of the discharge current expresses the state of charge of the electrochemical storage unit directly.

In a preferred embodiment, the load is constituted by a transistor controlled by the means for imposing a predetermined voltage across the terminals of the electrochemical storage unit.

Preferably, the means for imposing a predetermined voltage across the terminals of the electrochemical storage unit are constituted by an operational amplifier.

The electrochemical storage unit may power an electrical circuit whose minimum powering voltage is less than the predetermined voltage imposed across the terminals of the electrochemical storage unit while its state of charge is being measured.

Other characteristics and advantages will appear on reading the following description of a preferred embodiment of the method of the invention, given by way of non-limiting example with reference to the accompanying drawings, in which.

Figure 1:
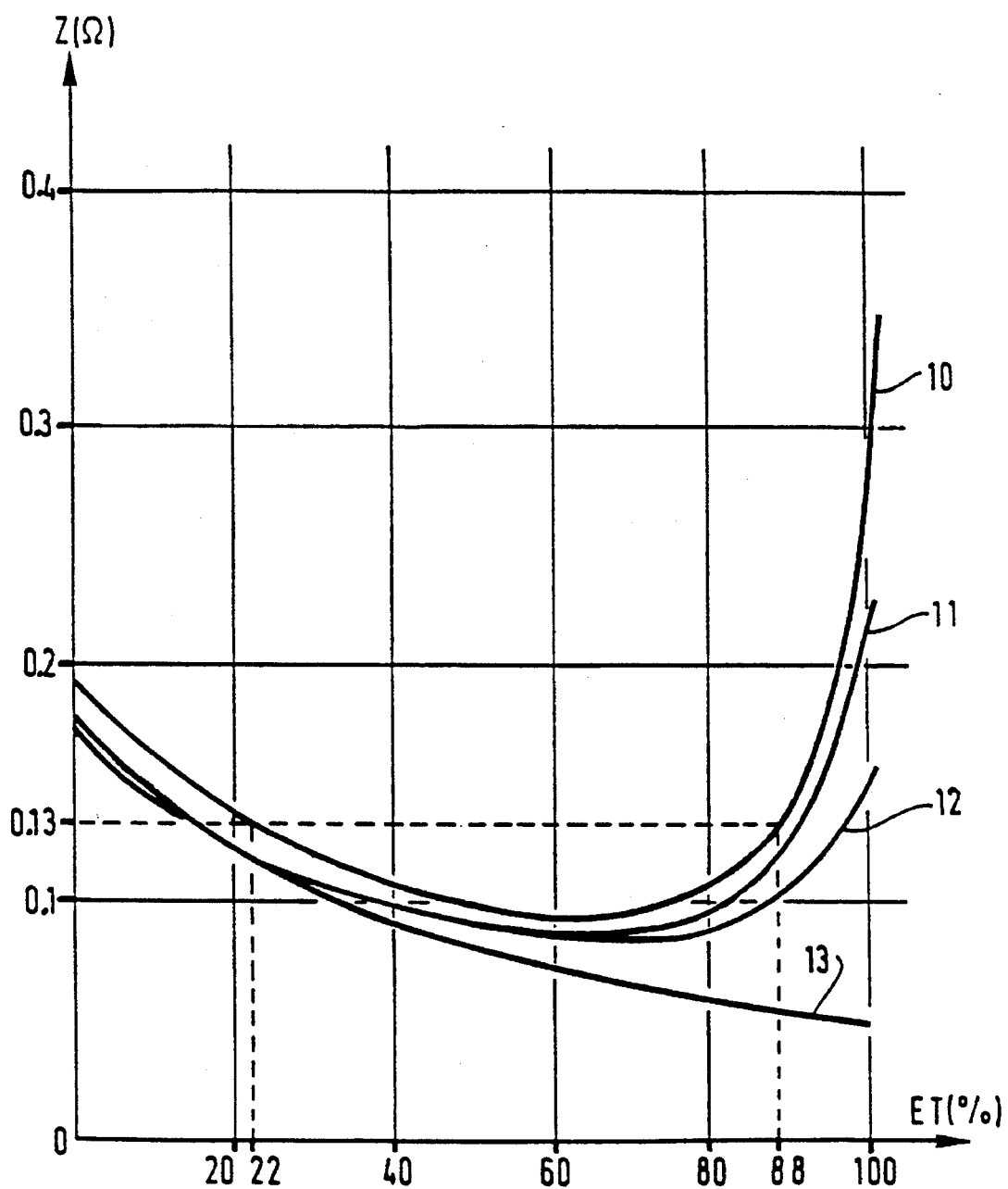
FIG. 1 shows the impedance characteristic of a nickel-cadmium secondary cell as a function of its state of charge for measurements taken under different stresses.
Figure 2:
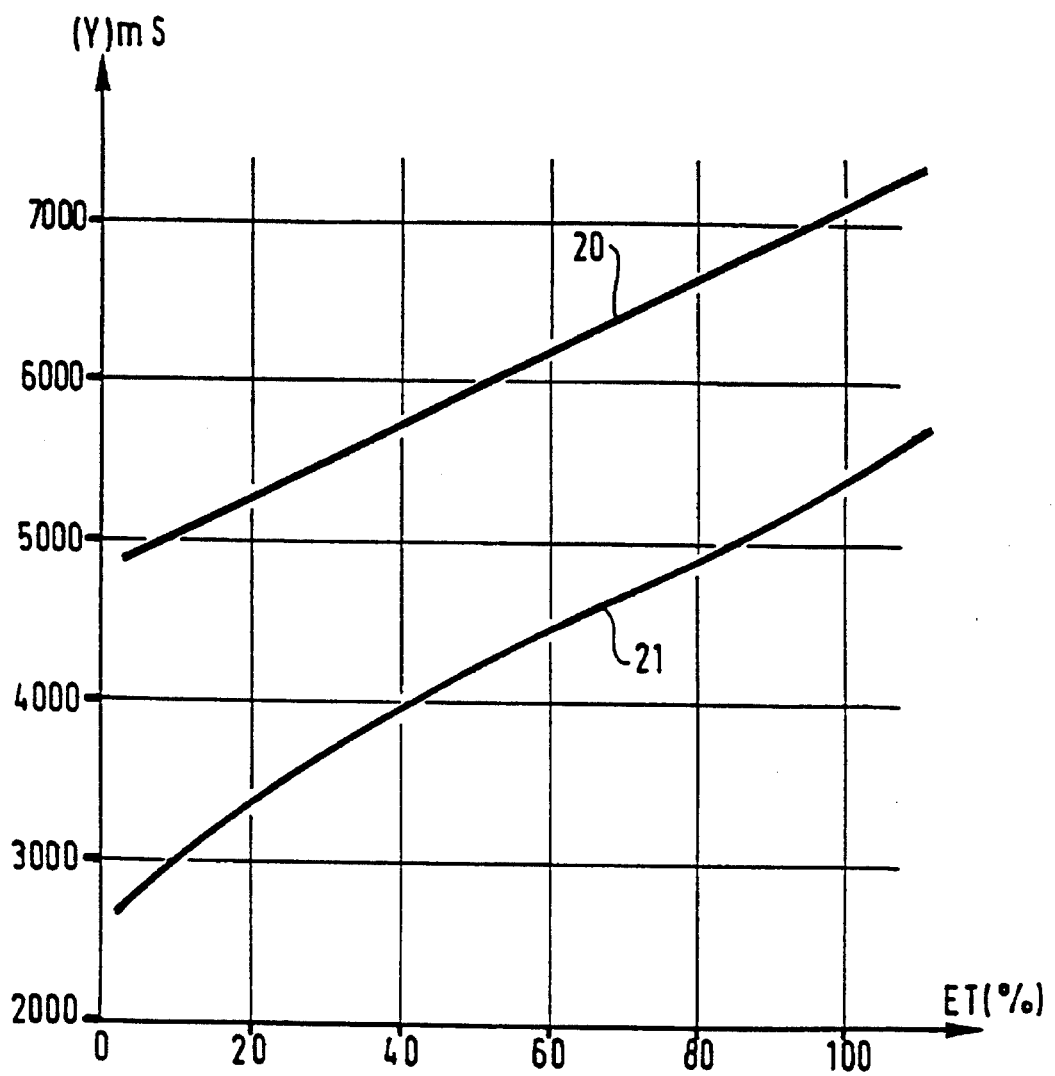
FIG. 2 shows the admittance characteristics of two nickel-cadmium secondary cells as a function of their states of charge, the characteristics being obtained by constant potential (potentiostatic) pulse discharge for periods of less than 100 ms.

In FIG. 1, and in FIG. 2, the state of charge is given along the x-axis, is referenced ET, and is expressed as a percentage of the maximum charge of a secondary cell. The impedance Z of the secondary cell is given up the yaxis, and is expressed in ohms. The secondary cell whose characteristic is shown is a SAFT nickel-cadmium secondary cell having nominal voltage of 1.2 volts and the reference VSE AA. Characteristics 10 to 13 show the variation in the impedance of the secondary cell as a function of state of charge for currents of:

20 mA AC (characteristic 10);

200 mA AC (characteristic 11);

200 mA AC and 10 mA DC (characteristic 12);

500 mA AC and 800 mA DC (characteristic 13).

The AC currents have a frequency of 0.1 Hz and it is necessary to take a plurality of successive measures for leach point of each characteristic so as to eliminate certain types of interference, in particular from measurement noise.

It can be observed that each of the characteristics 10, 11, and 12 has a minimum, and therefore has two identical values of impedance Z for two different states of charge. For example, for a current of 20 mA AC (characteristic 10), an impedance Z of 0.13 ohms corresponds both to a state of charge of 22% and to a state of charge of 88%. It is therefore not possible to determine the state of charge of a secondary cell for low currents.

However, characteristic 13 is unambiguous, i.e. one value of the impedance Z of the secondary cell corresponds to one state of charge only. It is therefore possible to determine the state of charge of a secondary cell on the basis of the value of its internal impedance if the current output by the secondary cell is high.

But, since high current cannot be drawn from a battery continuously solely for the purpose of determining its state of charge, the present invention proposes taking spot checks, drawing high current for short periods of time by generating constant potential discharge pulses, i.e. voltage, as explained below.

FIG. 2 shows the characteristics corresponding to the admittances of two nickel-cadmium secondary cells as a function of their states of charge, the characteristics being obtained by constant potential pulse discharge for periods of less than 100 ms.

The y-axis is graduated in millisiemens (mS) corresponding to the admittance Y ($Y=I/U$) of the secondary cells whose characteristics are referenced 20 and 21. The characteristics correspond respectively to those of SAFT nickel-cadmium secondary cells of the VR AA type and of the VSE AA type. It can been observed that the admittance characteristics are substantially linear. When the admittance characteristics are linear, it is preferable to determine the states of charge of the secondary cells directly on the basis of the admittances thereof.

The present invention therefore proposes using the admittance characteristic of a secondary cell preferably when a high current is taken from the secondary cell by applying constant potential pulses.

Figure 3:
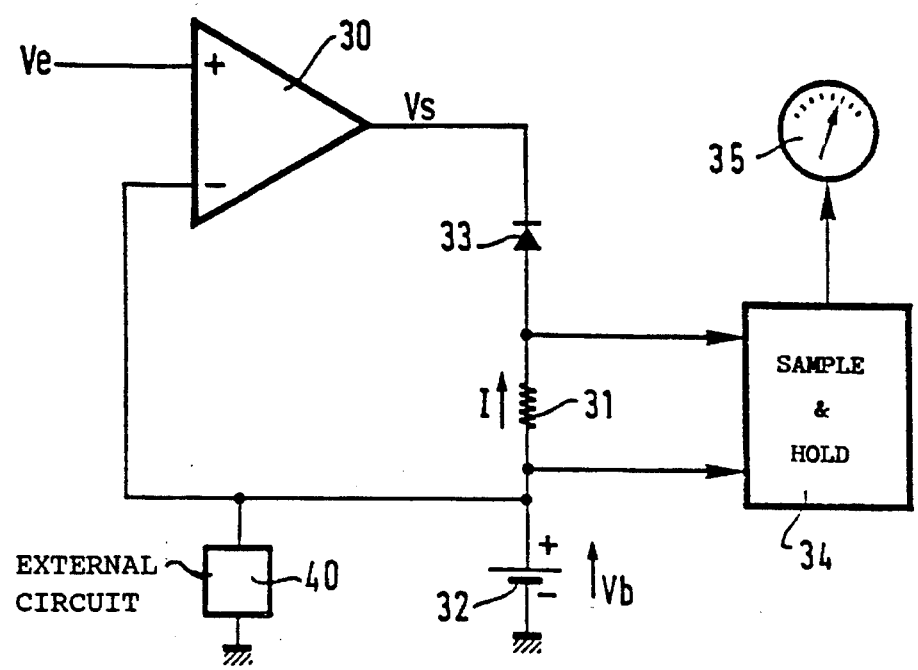
FIG. 3 shows apparatus enabling a constant potential pulse to be applied to a secondary cell.

FIG. 3 shows an embodiment of apparatus enabling a constant potential pulse to be applied to a secondary cell. The embodiment corresponds to an embodiment for performing the method of the invention.

A control signal Ve is applied to the non-inverting input of a potentiostat 30, e.g. constituted by an operational amplifier enabling a high output current to be supplied. The inverting input of the potentiostat 30 is connected to the positive electrode of a secondary cell 32 whose state of charge is to be determined. The negative electrode of the secondary cell 32 is connected to ground. The output of the potentiostat 30 is connected to the cathode of a diode 33 whose anode is connected to a terminal of a shunt resistor 31. The other terminal of the shunt resistor 31 is connected to the inverting input of the potentiostat 30. The shunt resistor 31 is connected in parallel with processing apparatus 34 for processing the voltage measured across the terminals of the resistor 31, which voltage is representative of the current flowing through the potentiostat 30 during the state of charge measurement periods, and therefore of the admittance of the secondary cell 32. The processing apparatus 34 co-operates with an indicator 35 indicating the state of charge of the secondary cell 32. Naturally, the secondary cell 32 may also be replaced by a battery of secondary cells.

Figure 4:
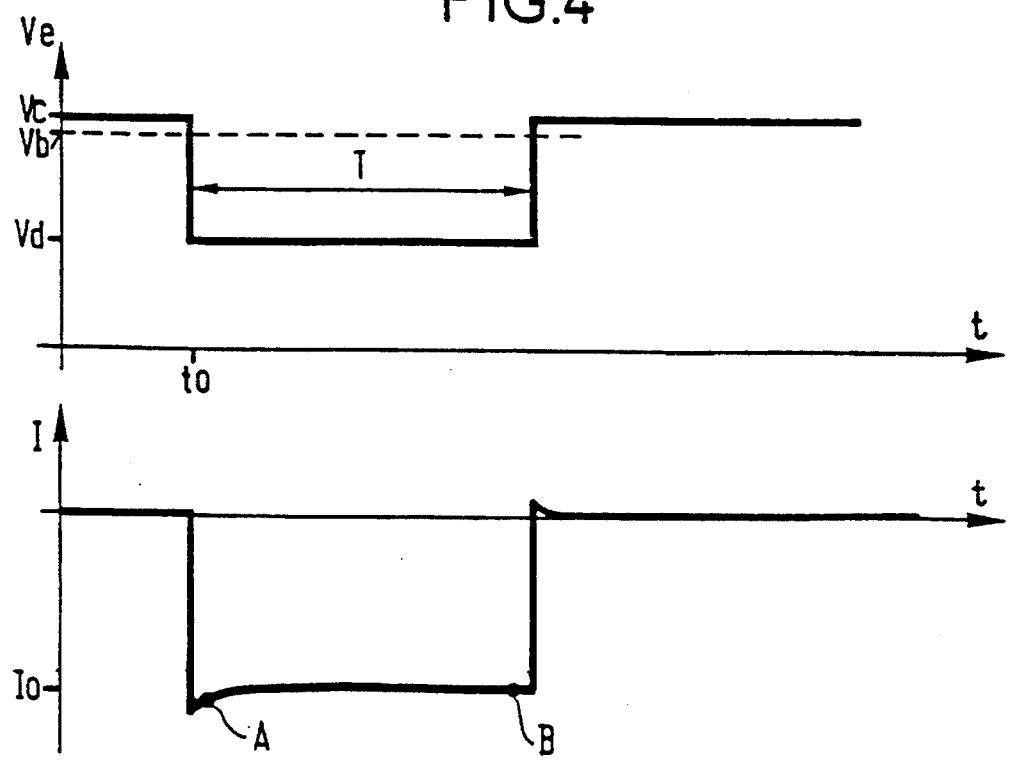
FIG. 4 is a timing diagram of the control voltage Ve shown in FIG. 3 and of the current discharge pulse flowing through the load resistor shown in FIG. 3.

FIG. 4 is a timing diagram of the control signal Ve and of the current discharge pulse delivered by the secondary cell 32.

The control signal Ve has a voltage Vc that is not less than the nominal voltage Vb of the secondary cell 32 when no pulse enabling the state of charge of the secondary cell 32 to be estimated is generated. The output voltage Vs of the potentiostat 30 is therefore equal to Vc. No current flows through the shunt resistor 31 since Vs is greater than Vb. This state corresponds to the rest state of the state of charge measuring system.

At time t0, the signal Ve changes to a discharge voltage Vd. This sudden change in the control signal corresponds to a constant potential pulse of duration T intended to enable the state of charge of the secondary cell 32 to be measured. The output voltage Vs then changes to Vd which is less than voltage Vb. The voltage across the terminals of the secondary cell 32 is then equal to Vd and a high current flows through the potentiostat 30 via the shunt resistor 31. The current, referenced $I_0$ varies in the same direction as the admittance presented by the secondary cell.

The $I=f(t)$ curve in FIG. 4 shows the variation in the current I flowing through the shunt resistor 31. At time $t_0$, the discharge pulse presents a peak, and then becomes stable at a value of $I_0$. Current $I_0$ may be very high, e.g. about 15 A for low-capacity nickel-cadmium secondary cells. The current $I_0$ being measured by the apparatus 34 makes it possible to determine the state of charge of the secondary cell 32 for display on the indicator 35. The apparatus 34 may determine either the admittance or the impedance of the secondary cell 32, as a function of the appearance of the respective characteristics (FIGS. 1 and 2). For example, the apparatus 34 comprises a sample-and-hold circuit which measures the voltage across the terminals of the resistor 31 at a time t after t0. Time t is preferably sufficient for $I_0$ to be measured at a time that is distant from the start of the pulse. The variation in the current $I_0$ at the start of the pulse is considerable, and measuring $I_0$ at the point A is less accurate than measuring it at a point B preferably situated at an instant immediately preceding time t0+T at which the control signal Ve changes back to Vc, thereby ending the state of charge measurement. The measurement instant corresponds to the moment when the voltage across the terminals of the shunt resistor 31 is measured. The sample-and-hold circuit taking the measurement is therefore controlled as a function of the duration T which it is advisable to minimize in order to reduce the consumption of current required for evaluating the state of charge. The duration T depends in particular on the type of secondary cells used and on the accuracy desired. The choice of the duration T depends on a compromise between the desired accuracy and the energy consumed by the measurement, given that a long duration T enables a good degree of accuracy to be obtained for the state of charge measurement at the expense of power consumption.

Since the current measured across the terminals of the shunt resistor 31 is proportional to the state of charge of the secondary cell, a new estimate of the state of charge is made at each new discharge pulse. For example, such estimates may be made cyclically on command from a clock signal, in order to enable the variation in the state of charge to be monitored regularly. In another embodiment, the voltage pulses of Ve are generated on command from the user, when the user wishes to determine the state of charge of the secondary cell.

One of the advantages of the invention is that the pulse discharge is calibrated, i.e. the secondary cell 32 supplies a voltage Vd while the state of charge is being measured. If the voltage Vd is high enough to enable an electrical circuit 40 powered by the secondary cell 32 to be operated, the electrical circuit 40 is in no way disturbed by the state of charge measurement.

By way of example, when the FIG. 3 apparatus is used for measuring the state of charge of a battery of secondary cells in series, with each cell having a nominal voltage of 1.2 volts, voltage Vc can be 15 volts, and voltage Vd can be 10 volts, when 10 volts is enough to power the circuit 40 for which the battery is the power source.

The voltage Vd imposed across the terminals of the electrochemical storage unit 32 while its state of charge is being measured must therefore be not less than the minimum voltage needed to power the circuit 40.

Another advantage of the invention is that measuring the discharge current enables the admittance Y of the secondary cell under test to be determined directly, since the following relationship is satisfied: $Y=I_0/Vd$. In fact, measuring $I_0$ enables a magnitude proportional to Y to be obtained, since it is necessary to take account of the current flowing through the shunt resistor 31. Thus, when Y varies linearly with the state of charge of the secondary cell 32, as is the case for the two secondary cells VR AA and VSE AA, measuring $I_0$ enables the state of charge of the secondary cell to be determined directly.

Voltage stress is the same for all the secondary cells of the same type, regardless of their capacities. Constant potential stress cannot destroy a low-capacity secondary cell. However, it is necessary to take account of the capacity of the secondary cell to be able to use the current measurement taken.

Using the FIG. 3 apparatus assumes using a potentiostat 30 that is capable of operating at high currents. The apparatus shown in FIG. 5 is therefore preferable to the apparatus shown in FIG. 3.

Figure 5:
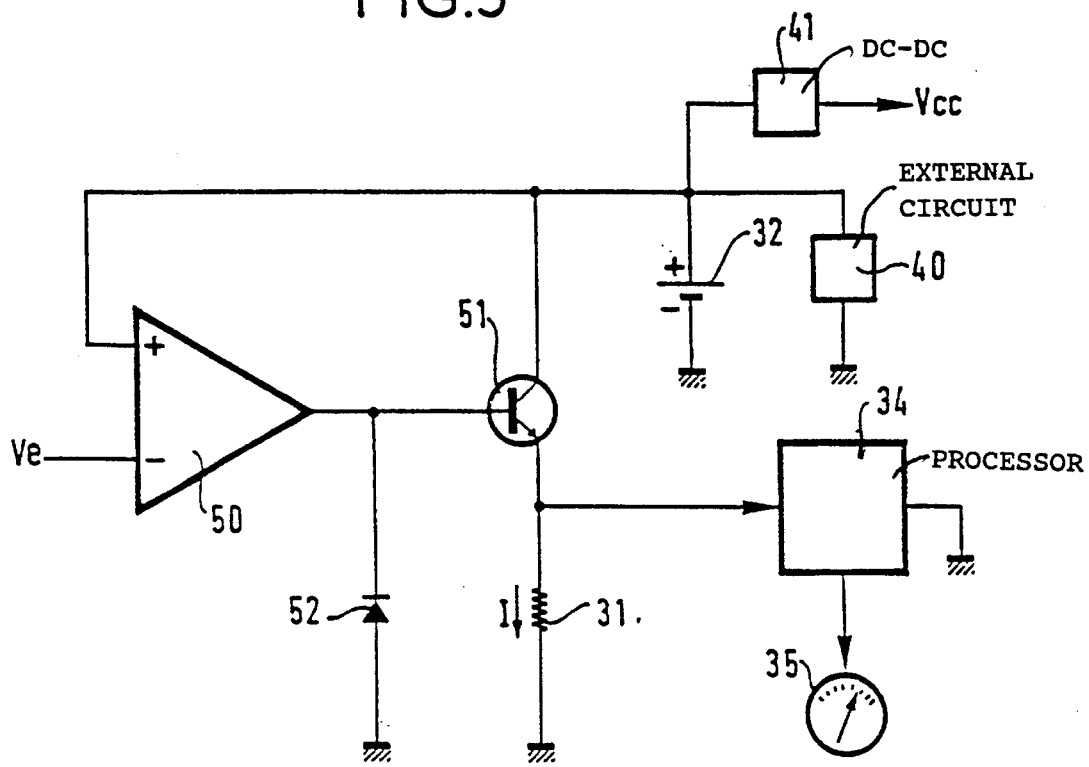
FIG. 5 shows another embodiment of apparatus enabling a constant potential pulse to be applied to a secondary cell.

The apparatus shown in FIG. 5 differs from that in FIG. 3 in that the potentiostat is replaced with a conventional operational amplifier 50 whose output is connected to a power amplification component 51, serving as a load and constituted in this example by a bipolar transistor, through which the secondary cell 32 is able to pass a current. The output of the operational amplifier 50 is connected to the base of the transistor 51 whose emitter is connected to the shunt resistor 31. The resistor 31 is of low resistance so as to consume a minimum amount of current. The base of the transistor 51 is protected by a protective diode 52 against negative voltages from the amplifier 50. The collector of the transistor 51 provides the negative feedback for the amplifier 50 and is connected to the positive terminal of the secondary cell 32.

This circuit layout has the advantage of using cheap and conventional components. The mean energy dissipated by the resistor 31 and by the transistor 51 is low when the constant potential pulses are spaced apart from each other in time, and enables the components used to be miniaturized. The bipolar transistor 51 may also be replaced by another component, e.g. by a MOSFET power transistor or by an insulated gate bipolar transistor (IGBT).

It is also possible to replace the shunt resistor 31 with a Hall-effect sensor, the essential requirement being to measure the current delivered by the secondary cell 32 through the transistor 51. However, it is then necessary to modify the structure of apparatus 34.

Generating discharge voltage pulses also means that it is not necessary to know the type of secondary cell used, i.e. of its electrochemical couple, unlike the state of the art method. It is sufficient to know the nominal voltage Vb that should be supplied by the secondary cell or by the battery of secondary cells for it to be immediately possible to determine the voltages Vc and Vd satisfying the relationship Vd<Vb<Vc.

The duration for which a pulse is applied is preferably very short, e.g. lying in the range 1 ms to 1,000 ms.

In general terms, the apparatus of the invention for measuring the state of charge of an electrochemical storage unit includes:

a load, constituted in FIG. 3 by the potentiostat 30 and in FIG. 5 by the transistor 51, enabling a discharge current to be drawn from the electrochemical storage unit 32 under test on command, which discharge current is high enough for the internal impedance characteristic of the storage unit as a function of its state of charge to be unambiguous;

means for measuring the discharge current, which means are constituted by the shunt resistor 31, the processing apparatus 34 and the indicator 35; and means for imposing a predetermined voltage across the terminals of the electrochemical storage unit so that the discharge current measurement expresses the state of charge of the electrochemical storage unit directly, which means are constituted in the preceding description by a potentiostat 30 or by an operational amplifier 50.

Naturally, the present invention is not limited to secondary cells, and it may also be applied to electrochemical storage units constituted by primary cells. However, the invention applies solely to electrochemical storage units having internal impedance characteristics as a function of their states of charge that are unambiguous.

The powering voltages for the potentiostat 30 or the operational amplifier 50, and for the processing apparatus 34 may be obtained from the voltage supplied by the electrochemical storage unit under test, e.g. via a DC-DC converter. Such a DC-DC converter is referenced 41 in FIG. 5 and it supplies a powering voltage Vcc for the apparatus for measuring state of charge.

The invention is not limited to the two above-described embodiments, and other components may be used to impose a voltage across the terminals of an electrochemical storage unit, thereby enabling the current delivered by the storage unit under this stress to be measured.

We claim:

1. A method of measuring the state of charge of an electrochemical storage unite having a pair of output terminals at which appears, in the absence of any load, a nominal voltage, said storage unit further having an internal impedance which varies in accordance both with the load across the output terminals and with the state of charge of the storage unit, said method comprising the steps:

applying a stress pulse across said output terminals in the form of a voltage pulse having a limited duration and a predetermined non-zero fixed voltage sufficiently less than said nominal voltage so as to cause the storage unit to deliver an external discharge current having a monotonic relationship with said state of charge;

measuring said external discharge current across the output terminals during the application of the stress pulse; and determining said state of charge directly from the measured external discharge current.

2. A method according to claim 1, wherein said electrochemical storage unit comprises a plurality of secondary cells connected in series.

3. A method according to claim 1, wherein said discharge current is measured immediately before the end of said voltage pulse.

4. A method according to claim 1, wherein said predetermined fixed voltage is not less than a minimum voltage required by an electrical circuit whose power source is constituted by said electrochemical storage unit.

5. A method according to any one of claims 1 to 4, wherein it is applied to measuring the state of charge of nickel-cadmium type secondary cells.

6. Apparatus for measuring the state of charge of an electrochemical storage unit, comprising:

means for imposing a stress pulse across the output terminals of said electrochemical storage unit in the form of a predetermined fixed non-zero voltage to thereby cause a discharge current to be drawn from said electrochemical storage unit for a limited time, said predetermined fixed voltage being sufficiently less than a nominal voltage of the storage unit that said discharge current provides an unambiguous measure of said state of charge for all possible states of charge of said electrochemical storage unit;

means for measuring said discharge current; and means for determining the state of charge of said electrochemical storage directly from the measured discharge current.

7. Apparatus according to claim 6, wherein said means for imposing a stress pulse comprises a load in the form of a transistor connected across the terminals of said electrochemical storage unit.

8. Apparatus according to claim 6, wherein said means for imposing a stress pulse comprises an operational amplifier.

9. Apparatus according to any one of claims 6 to 8, wherein said electrochemical storage unit powers an electrical circuit having an associated minimum powering voltage less than said predetermined fixed voltage.

* * * * *